United States Patent [19]
Nakamura

[11] Patent Number: 6,144,234
[45] Date of Patent: *Nov. 7, 2000

[54] SAMPLE HOLD CIRCUIT AND SEMICONDUCTOR DEVICE HAVING THE SAME

[75] Inventor: Hiroyuki Nakamura, Atsugi, Japan

[73] Assignee: Canon Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/994,999

[22] Filed: Dec. 19, 1997

[30] Foreign Application Priority Data

Dec. 26, 1996 [JP] Japan ..................... 8-347636

[51] Int. Cl.[7] ............................................. G11C 27/02
[52] U.S. Cl. ............................................. 327/94; 327/92
[58] Field of Search .................... 327/91, 92, 93, 327/94, 95, 96, 97; 341/122–125

[56] References Cited

U.S. PATENT DOCUMENTS 5,130,572  7/1992  Stitt et al. ................................. 327/96
5,289,278  2/1994  Bird ......................................... 348/473
5,378,938  1/1995  Birdsall et al. ........................... 327/94
5,473,273  12/1995  Werner, Jr. et al. ..................... 327/94
5,539,339  7/1996  Van Rens ................................ 327/51
5,844,433  12/1998  Nishimura ............................... 327/94

*Primary Examiner*—My-Trang Nuton
*Attorney, Agent, or Firm*—Fitzpatrick, Cella, Harper & Scinto

[57] ABSTRACT

To form a high-speed, high-precision sample hold circuit with the minimum number of elements and low current consumption, there is provided a sample hold circuit including an operational amplifier including differential input stage in which sources or emitters are commonly connected, a cascode current mirror circuit for receiving a differential output from the different input stage, and a push-pull output stage having a diamond circuit connected to the cascode current mirror circuit, wherein a hold capacitor is connected to the output of the operational amplifier, and the push-pull output stage is switched between a buffer operation mode and a high-impedance output operation mode in accordance with a logic signal.

10 Claims, 5 Drawing Sheets

NON-FEEDBACK TYPE BUFFER

VOLTAGE FEEDBACK TYPE

INTEGRATING TYPE

DIODE BRIDGE USED AS HIGH SPEED SAMPLE HOLD SWITCH

OUTPUT BUFFER USED IN HIGH SPEED SAMPLE HOLD CIRCUIT

BOOST STRAP

2nd EMBODIMENT

SAMPLE HOLD CIRCUIT AND SEMICONDUCTOR DEVICE HAVING THE SAME

BACKGROUND OF THE INVENTION

1. Field of the Invention

The present invention relates to a sample hold circuit formed in a semiconductor integrated circuit in a semiconductor device and a semiconductor device having the same.

2. Related Background Art

A conventional sample hold circuit is designed to hold an input level at every sample timing and used to measure the instantaneous value of a signal which changes with time. For example, this circuit is used on the input stage of an A/D converter to temporarily hold an analog value. That is, the circuit is used on the input stage of the A/D converter when the level of the analog value is to be converted into a digital value.

This sample hold circuit includes a high-speed non-feedback type circuit (poor precision) like the one shown in FIG. 1, a low-speed, high-precision feedback type circuit like the one shown in FIG. 2, an integrating type circuit like the one shown in FIG. 3, which has performance intermediate between the above circuits, and the like.

As shown in FIG. 1, the non-feedback type is the most basic sample hold circuit scheme, and constituted by an input buffer circuit 11, a switch circuit 12, a hold capacitor $C_H$, and a high-input-impedance output buffer 13. An analog signal is input to an input terminal 10. The switch circuit 12 is turned on/off in accordance with a sampling timing. The output voltage of the input buffer circuit 11 which is set when the switch circuit 12 is on in the sample mode is charged into the hold capacitor $C_H$ in an acquisition time. When the switch circuit 12 is turned off, the hold mode is set, and a voltage corresponding to the charged voltage is output from the output buffer 13. For example, this output voltage is converted into a digital value before the arrival of a timing signal next to the sampling timing. Alternatively, the output voltage is shaped into a staircase waveform to be sampled.

In this case, as the switch circuit 12, a switch circuit 19 using a diode bridge 18 like the one shown in FIG. 4 is generally used. Referring to FIG. 4, constant current sources I4 and I5 are repeatedly turned on/off under the control of a switch control signal 17, and an analog signal output from the input terminal 10 when the diodes of the diode bridge 18 are turned on is charged into a hold capacitor $C_H$. When the diodes of the diode bridge 18 are not turned on, the charged voltage of the hold capacitor $C_H$ is held. The switch circuit 19 has a high speed because the switching speed of the diode bridge 18 as a switching element is high as compared with other elements such as a binary transistor, an FET, and a MOSFET. This is because, the diode bridge 18 has a small capacitance component.

As shown in FIG. 5, the output buffer 13 is generally constituted by FET source followers M5 and M6 and emitter followers Q12 and Q13. Referring to FIG. 5, a hold capacitor $C_H$ for holding an analog value on the previous stage is connected to an input terminal 20, and the charged voltage of the hold capacitor $C_H$ is applied to the gates of the MOS transistors M5 and M6. The source outputs of the MOS transistors M5 and M6 of an EFT source follower circuit arrangement are respectively connected to constant current sources I6 and I7 and are input to the bases of the transistors Q12 and Q13 of a push-pull emitter follower arrangement to be output to an output terminal 14 through the emitters of the transistors Q12 and Q13. In this case, since a voltage is input to the voltage-dependent MOSFET, a high-speed operation is performed. With the output arrangement using the emitter followers Q12 and Q13, high-speed output response can be realized in accordance with the input voltage.

The arrangement of the non-feedback type shown in FIG. 1, however, provides no compensation for variations in power supply voltage, changes in temperature, and the like, and hence a high precision is difficult to attain. To satisfy both the demands for higher speed and precision, a high-speed operational amplifier with an FET input is used as an output buffer 21, and a switch circuit 19 is bootstrapped from the output of the amplifier to increase the precision. More specifically, the output of the output buffer 21 is fed back to the switch circuit 19. When the output increases, the levels of current sources I4 and I5 are decreased to decrease the charged voltage of a capacitor $C_H$, thereby increasing the ON resistance of a switch diode 18. In this manner, a negative feedback operation from the output buffer 21 is performed to obtain an accurate charged voltage.

With such a circuit arrangement, however, the current consumption may increase because of increases in circuit size and the levels of the constant current sources I4 and I5.

According to the feedback type shown in FIG. 2, since a voltage is not fed back to the switch circuit but is fed back to the overall circuit up to the input terminal of the input buffer 15 including the switch unit 12, a high precision can be basically obtained, but a delay is caused by a feedback operation. That is, a high-speed circuit is difficult to realize. Although a circuit of this type is often used as a standard monolithic sample hold circuit arrangement for audio signal processing, this circuit is not suited for a video signal processing circuit arrangement and the like requiring high-speed processing.

According to the integrating type in FIG. 3, which exhibits performance intermediate between the above two types, a hold capacitor $C_H$ is connected between the inverting input terminal and output terminal of an operational amplifier 16, and a switch 12 is arranged between an input resistor $R_{IN}$ and a feedback resistor $R_F$. Since the switch unit is in the negative feedback system, a high precision can be obtained. It is, however, difficult to realize high-speed signal processing because a band is limited by the time constants of the input resistor $R_{IN}$ and the hold capacitor $C_H$.

With the above circuit arrangements, it is difficult to satisfy both the demands for higher speed and precision. To satisfy the demands, for example, the circuit size and the current consumption must be increased.

SUMMARY OF THE INVENTION

The present invention has been made in consideration of the above points, and has as its object to provide a high-speed, high-precision sample hold circuit with the minimum number of elements and low power consumption, and a low-cost monolithic type sample hold circuit with a small number of manufacturing steps.

It is another object of the present invention to provide a sample hold circuit including an operational amplifier which has a push-pull output stage and in which an output terminal and an inverting input terminal are connected to perform a buffer operation and each output transistor of the push-pull output stage is controlled to be set in the operative state or the cutoff state in accordance with a logic signal, and a semiconductor device having the sample hold circuit.

It is still another object of the present invention to provide a sample hold circuit comprising an operational amplifier including differential input stage in which sources are commonly connected, a cascode current mirror circuit for receiving a differential output from the different input stage, and a push-pull output stage having a diamond circuit connected to the cascode current mirror circuit, wherein a hold capacitor is connected to an output of the operational amplifier, and the circuit further comprises switching means for switching the push-pull output stage between a buffer operation mode and a high-impedance output operation mode in accordance with a logic signal, and a semiconductor device having the sample hold circuit.

It is still another object of the present invention to provide a sample hold circuit comprising an operational amplifier including differential input stage in which main electrodes are commonly connected, a cascode current mirror circuit for receiving a differential output from the different input stage, and a push-pull output stage having a diamond circuit connected to the cascode current mirror circuit, wherein a hold capacitor is connected to the push-pull output stage, and the circuit further comprises switching means for switching the push-pull output stage between a buffer operation mode and a high-impedance output operation mode in accordance with a logic signal, and a semiconductor device having the sample hold circuit.

According to the above arrangement, the push-pull output stage itself also serves as the switching unit of the sample hold circuit so that the sample mode is set when the output transistor is in the operative state, and the hold mode is set when the output transistor is in the cutoff state. That is, the operational amplifier serves as a sample hold circuit. For this reason, the overall circuit is included in the feedback system, and hence a high precision can be attained. In addition, when the push-pull output transistor is set in the operative state by a logic signal, the operational amplifier is set in the buffer operation mode, and the operation speed is maximized. When a shift from the cutoff state to the operative state occurs, necessary charges are supplied to the base capacitance of the output transistor to form the feedback system again. As a result, the output follows the input owing to the slewing rate of the operational amplifier, and the sample mode is set. With a circuit arrangement having a high slewing rate, therefore, the operation speed can be increased.

To further increase the operation speed, feedback may be performed from the input terminal of the push-pull output state to the inverting input terminal of the operational amplifier.

With this arrangement, a circuit designed to always perform a buffer operation and a push-pull output stage serving as both an output buffer and a switch are formed. That is, an operation is performed while a high slewing rate is maintained, and hence a higher operation speed can be attained.

In addition, according to the present invention, the output transistors of the push-pull output stage preferably have the same input capacitance.

As the operation speed increases, clock feedthrough with respect to an output passing through the parasitic capacitance of each output transistor becomes noticeable owing to a logic signal for controlling the switch unit, and the performance of the sample hold circuit deteriorates in terms of the hold steps. However, since logic signals for controlling the transistors of the push-pull output stage as the switch unit have opposite phases, the clock feedthrough in the output can be canceled out by equalizing the input parasitic capacitances of the output transistors.

DETAILED DESCRIPTION OF THE PREFERRED EMBODIMENTS

The present invention will be described below with reference to the accompanying drawings.

First Embodiment

Figure 7:
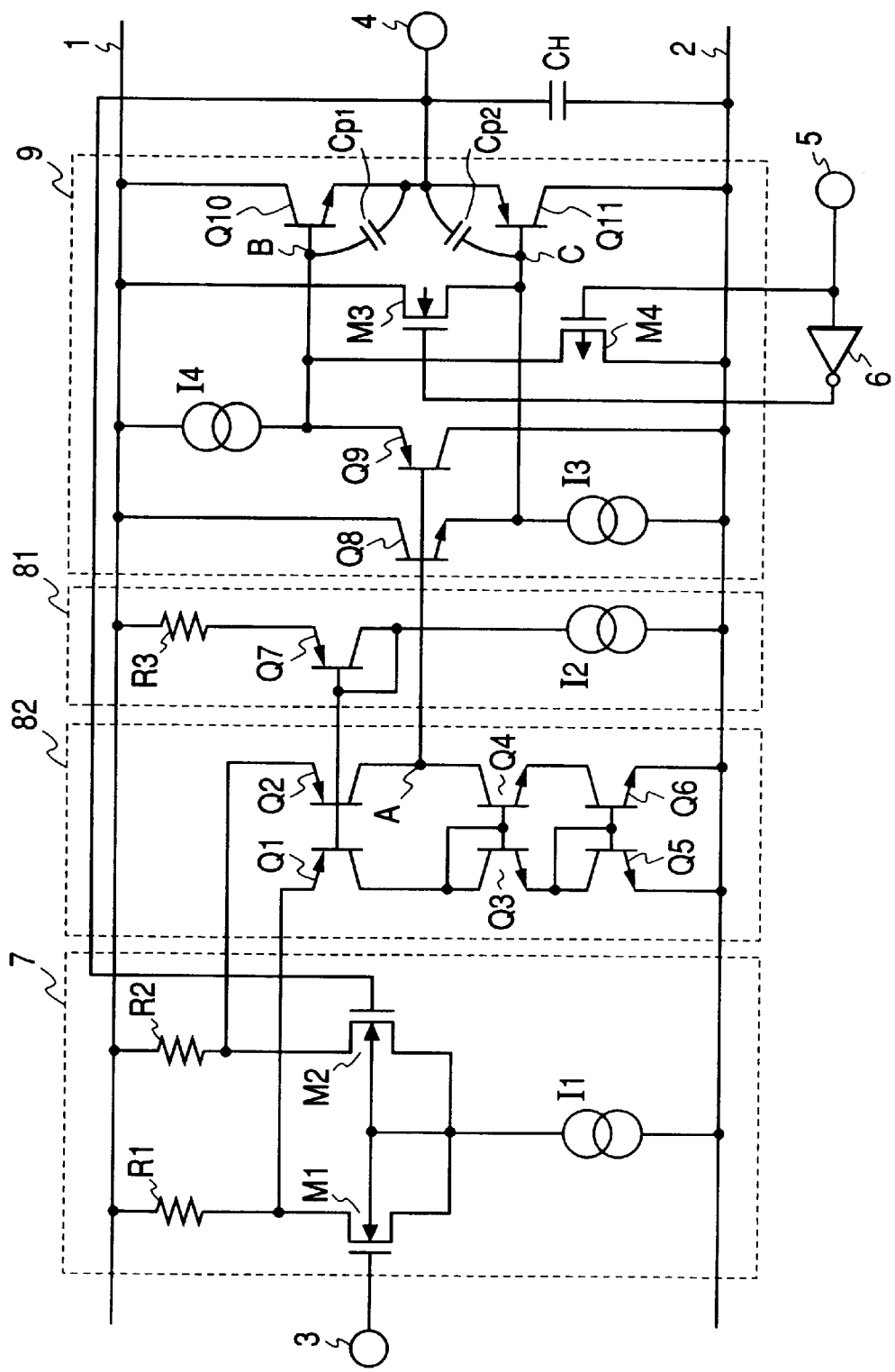
FIGS. 7 and 9 are circuit diagrams for respectively explaining sample hold circuits according to preferred embodiments of the present invention.

FIG. 7 is a circuit diagram for explaining a sample hold circuit according to an embodiment of the present invention. Referring to FIG. 7, this circuit includes a power supply line 1 for supply power, a GND line 2 set at a ground potential, a signal input terminal 3, an output terminal 4 from which a sampled/held result is output, a logic signal input terminal 5 to which a sampling logic signal for a sampling timing is input, an inverter 6 for inverting and outputting an input signal, a differential input stage 7 of this sample hold circuit in which main electrodes such as source and emitter electrodes are commonly connected, a bias circuit 81 for a cascode current mirror circuit, a cascode circuit 82 of a cascode current mirror circuit arrangement with an emitter input for receiving a differential output from the differential input stage 7, a diamond push-pull output stage/switch unit 9 constituted by a push-pull output stage using a diamond circuit, and a constant current source circuit I1–I4. The sample hold circuit also includes constant current sources I1 to I4 for supplying constant currents, PNP transistors Q1, Q2, Q7, Q9, and Q11, NPN transistors Q3, Q4, Q5, Q6, A8, and Q10, NMOS transistors M1, M2, and M4, a PMOS transistor M3, resistors R1, R2, and R3, a hold capacitor $C_H$, and parasitic base capacitances $C_{P1}$, and $C_{P2}$ of the transistors Q10 and Q11.

The operation of this circuit will be described in detail next with reference to FIGS. 8A to 8E. An analog input signal is input to the input terminal 3.

Figure 1:
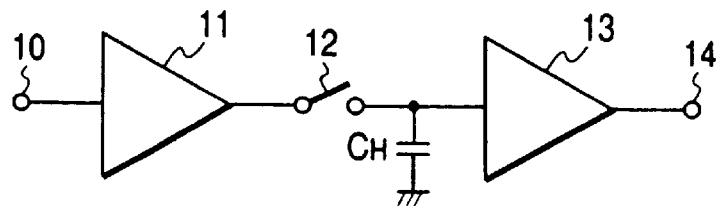
FIGS. 1 to 3 and FIG. 6 are circuit diagrams for respectively explaining sample hold circuits.
Figure 2:
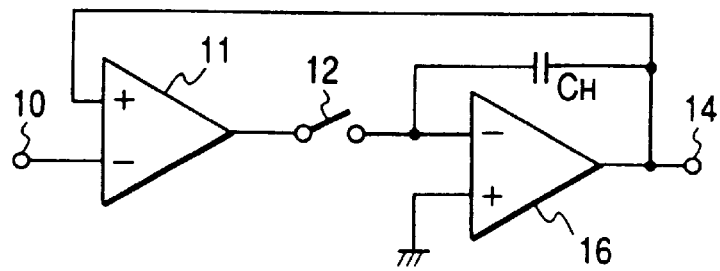
Figure 3:
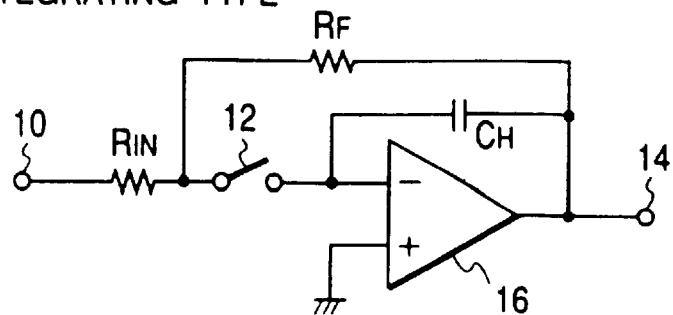
Figure 4:
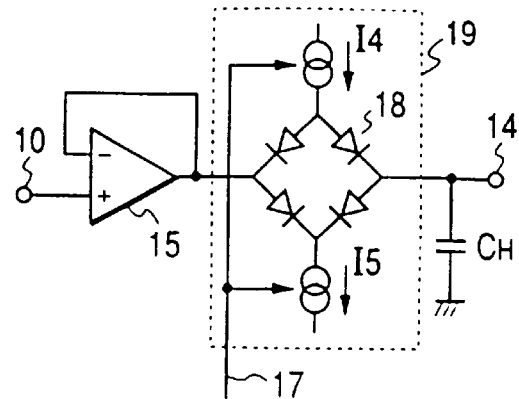
FIG. 4 is a circuit diagram for explaining a switch circuit which can be applied to a sample hold circuit.
Figure 5:
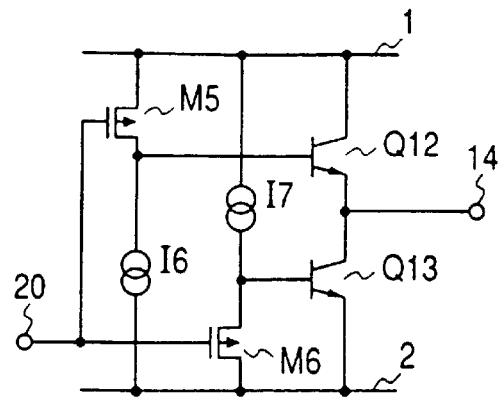
FIG. 5 is a circuit diagram for explaining an output buffer circuit which can be applied to a sample hold circuit.
Figure 6:
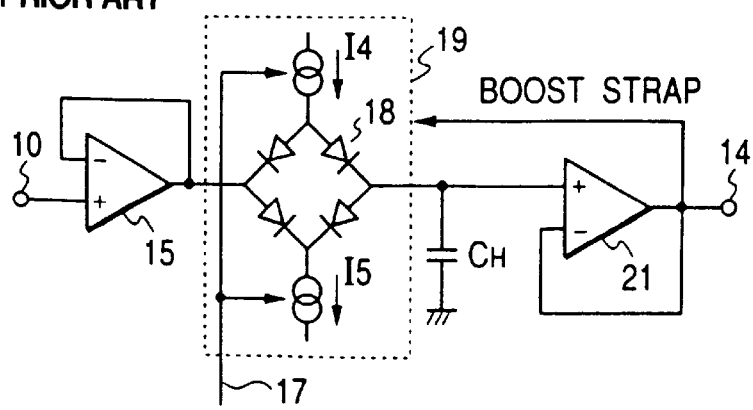

Assume that a logic signal (FIG. 8A) input to the logic signal input terminal 5 is at Lo level, i.e., the switch circuit 12 in FIG. 1 is in the OFF state, and this state will be referred to as a hold state. At this time, the NMOS transistor M3 and the PMOS transistor M4 are in the ON state by an inverted signal obtained by inverting the logic signal in the inverter 6, and the output stage of the diamond push-pull output stage/switch unit 9 is in the inoperative state. In addition, the bases of the transistors Q10 and Q11 are respectively set at the potentials of the GND line 2 and the power supply line 1, i.e., in a cutoff region. For this reason, the output of the output terminal 4 is set in a high-impedance state, and set at a given potential $V_{CH}$ owing to the charges stored in the hold capacitor $C_H$. In addition, at this time, no feedback system is formed by the sample hold circuit constituting an operational amplifier, and hence the differential input stage 7 and the cascode circuit 82, which have an output at a point A in FIG. 7, serve as a comparator. Therefore, if $V_{CH} > V_{in}$ then, the A point potential as the output of the comparator constituted by the differential input stage 7 and the cascode current mirror unit 8 is at Lo level (FIG. 8C).

Consider a case in which the logic signal at the input terminal 5 changes from Lo level to Hi level. At this time, the NMOS transistor M3 and the PMOS transistor M4 change from the conductive (ON) state to the nonconductive (OFF) state, and the B and C point potentials are changed by current sources I3 and I4 from the A point potential to a potential set by the push-pull transistors Q8 and Q9 by a level shift operation (FIG. 8D). When the NMOS transistor M3 and the PMOS transistor M4 are turned off, the output stage/switch unit 9 is set in the operative state. As a result, the output impedance decreases, and a negative feedback system is formed again. The sample hold circuit in FIG. 7 then operates as an operational amplifier. The output of the output terminal 4 is therefore changed by the slewing rate of the operational amplifier which is the sample hold circuit such that the negative input of the differential input stage 7 is set to be equal to the potential of the signal input terminal 3 (FIG. 8E).

Figure 8:
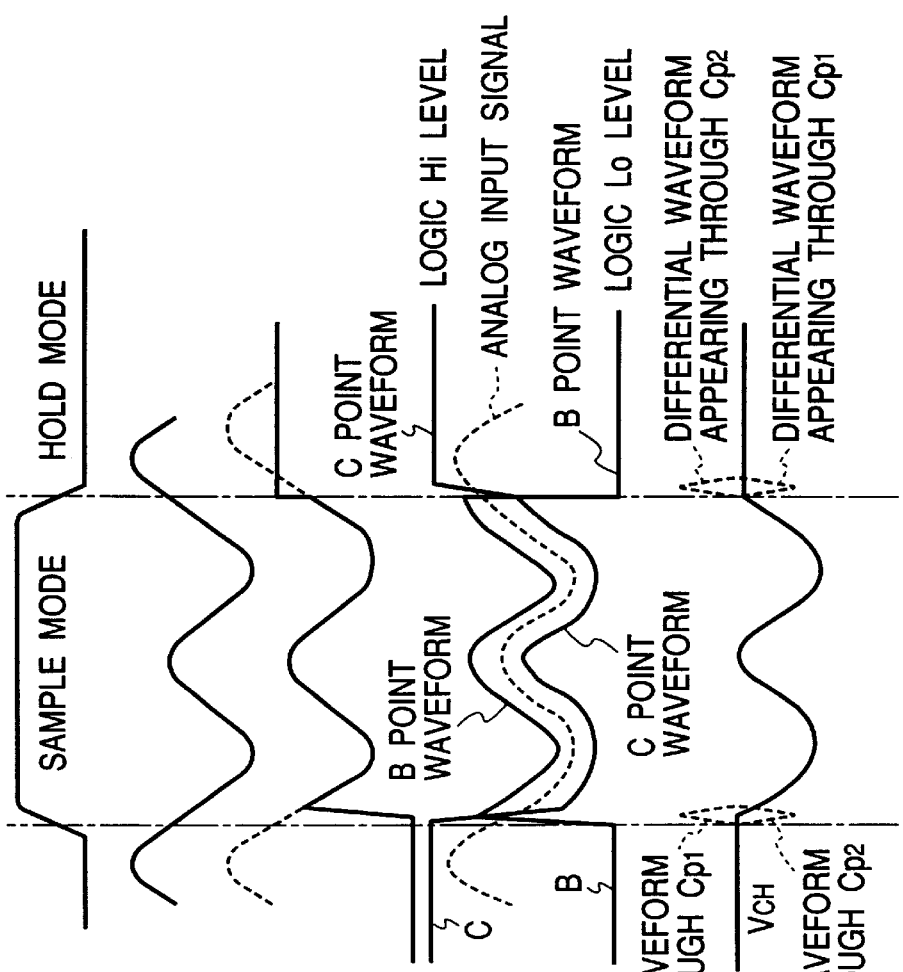
FIGS. 8A, 8B, 8C, 8D and 8E are timing charts for explaining an operation of the circuit in FIG. 7 or 9.

When the NMOS transistor M3 and the PMOS transistor M4 are turned off, the B and C point potentials change in the form of pulses owing to the parasitic base capacitances $C_{P1}$ and $C_{P2}$ between the base/emitter paths of the transistors Q10 and Q11 (FIG. 8D). For this reason, waveforms formed by differentiating pulses like those indicated by the dotted lines on the output waveform in FIG. 8E appear in the output from the output terminal 4. By equalizing the parasitic capacitance values of the transistors Q10 and Q11, the differential waveforms are canceled out. As a result, the output waveform becomes identical to the input analog signal in FIG. 8B, and no impulse removal period is required in a switching operation. Consequently, the acquisition time can be shortened, and high-speed sampling can be performed.

The operation of each unit will be described next in association with a transition from the sample mode to the hold mode. In this case, the NMOS transistor M3 and the PMOS transistor M4 change from the OFF state to the ON state. A point B is set at the GND potential by the PMOS transistor M4, and a point C is set at the power supply potential by the NMOS transistor M3. Since the potentials abruptly change as shown in 8D, differential waveforms appear in the output from the output terminal 4 as in the case of the transition from the hold mode to the sample mode. These differential waveforms are, however, canceled out (FIG. 8E). In addition, since the transistors M3 and M4 are respectively NMOS and PMOS transistors, when the gate potentials change from the points C and B by threshold voltages, these transistors are turned on. As a result, the output terminal 4 is set at a high impedance, and no negative feedback system is formed. The hold capacitor $C_H$ is connected to the output terminal 4 to trace the same potential as the input analog voltage in a sample hold operation with a low-impedance output. In addition, the logic signal changes to Lo level (FIG. 8A), and the input analog voltage at the moment of this switching change can be maintained. As a result, a short aperture and a small number of hold steps can be realized.

In this case, the cascode current mirror circuit 82 is used for the following reason. Outputs from the differential stages M1 and M2 are current outputs, and input voltages are converted into current signals by the MOS transistors M1 and M2. Thereafter, the signals are transmitted to the mirror circuit of the transistors Q1 to Q6 with a current. The current is converted into a voltage at the point A. Since conversion from a current to a voltage which causes phase rotation is performed only once, phase compensation is not basically required. For this reason, a broadband arrangement can be realized. In this state, however, since the load driving ability is low, a diamond circuit serving as a buffer is arranged after the above arrangement to increase the driving ability. In addition, since the diamond circuits use complementary output transistors, a high-impedance state can be easily obtained by simultaneously controlling the bases of the transistors. Furthermore, since the operation of this circuit is an emitter follower operation or a cutoff operation, it can operate at the highest speed as a transistor.

Second Embodiment

Figure 9:
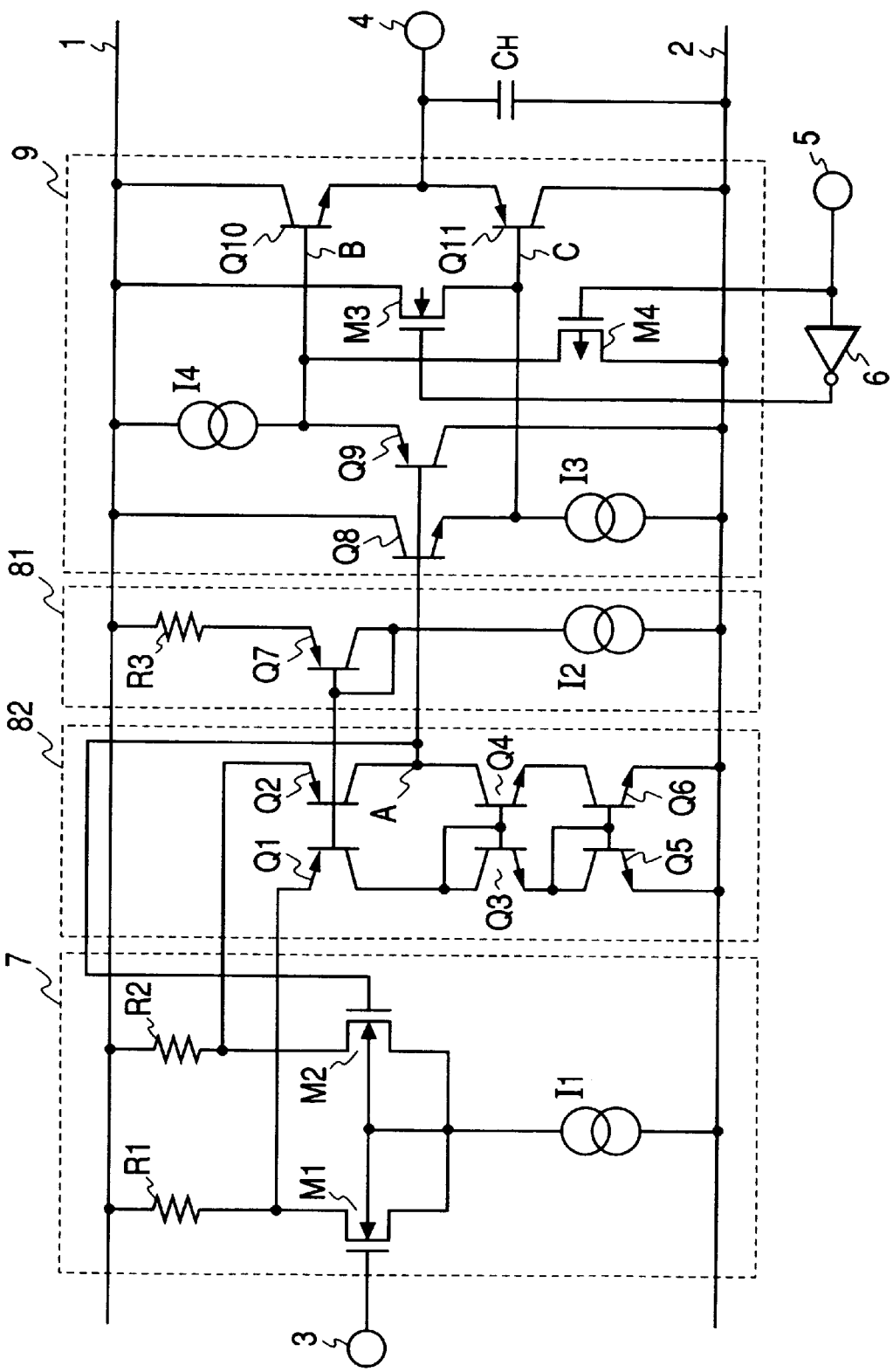

FIG. 9 shows the second embodiment of the present invention, in which negative feedback is performed from the input of an operational amplifier output push-pull stage 9, i.e., the output of a cascode current mirror constituting the second stage of the operational amplifier, to the inverting input terminal of an operational amplifier. In the arrangement shown in FIG. 7, negative feedback is performed from the output terminal 4 to the other input terminal of the differential input stage 7. In this embodiment, however, negative feedback is performed from a point A to the other input terminal of the differential input stage 7. In this case, since the switching unit 9 is outside the feedback circuit, an input signal is always input to the input terminal of the switching unit 9 after negative feedback processing by the differential input stage 7 and a second stage cascode circuit 82, although the second embodiment is inferior in precision to the first embodiment. For this reason, the operation speed is controlled within the time during which each of transistors Q8 to Q11 of the output stage/switching unit 9 shifts from the cutoff state to the operative state, and the operation speed of the second embodiment can be basically set to be higher than that of the first embodiment. The second embodiment is the same as the first embodiment in terms of hold steps. The waveforms at the respective portions described with reference to FIGS. 8A to 8E are the same as in this embodiment.

In the above embodiments, a hold potential corresponding to an input analog signal is held in a hold capacitor $C_H$. However, a buffer circuit having a high-impedance input stage may be arranged on the output stage of this capacitor to reduce a change in output voltage after it is held, i.e., a hold loop. This hold potential is then quantized into a digital value, thus realizing a high-precision, high-speed A/D conversion circuit.

In each embodiment described above, a hybrid semiconductor device including bipolar transistors and MOS transistors together is described. However, a device may be constituted by only MOS transistors in the analog operation region to attain a reduction in cost.

The above circuits can be variously modified within the spirit and scope of the present invention. In addition, each circuit described above can be formed in a semiconductor device by a general technique.

As has been described above, according to the present invention, by using a switching unit constituting a sample hold circuit as the push-pull output stage of an operational amplifier, a high-speed, high-precision sample hold circuit can be formed with the minimum number of elements.

What is claimed is:

1. A sample hold circuit comprising an operational amplifier including:

a differential input stage in which sources are commonly connected, a cascode current mirror circuit for receiving a differential output from said differential input stage, and a push-pull output stage having a diamond circuit configuration of four transistors and being connected to said cascode current mirror circuit, wherein a hold capacitor is connected to an output of said operational amplifier, and said circuit further comprises switching means for switching said push-pull output stage between a buffer operation mode and a high-impedance output operation mode in accordance with a logic signal.

2. A circuit according to claim 1, wherein NPN and PNP transistors constituting said push-pull output stage have the same input capacitance.

3. A circuit according to claim 1, wherein an output from said operational amplifier is negatively fed back to one input terminal of said differential input stage.

4. A circuit according to claim 1, wherein an output from said cascode current mirror is negatively fed back to one input terminal of said differential input stage.

5. A semiconductor device comprising said sample hold circuit defined in claim 1.

6. A sample hold circuit comprising an operational amplifier including:

a differential input stage in which main electrodes are commonly connected, a cascode current mirror circuit for receiving a differential output from said differential input stage, and a push-pull output stage having a diamond circuit configuration of four transistors and being connected to said cascode current mirror circuit, wherein a hold capacitor is connected to said push-pull output stage, and said circuit further comprises switching means for switching said push-pull output stage between a buffer operation mode and a high-impedance output operation mode in accordance with a logic signal.

7. A circuit according to claim 6, wherein NPN and PNP transistors constituting said push-pull output stage have the same input capacitance.

8. A circuit according to claim 6, wherein an output from said operational amplifier is negatively fed back to one input terminal of said differential input stage.

9. A circuit according to claim 6, wherein an output from said cascode current mirror is negatively fed back to one input terminal of said differential input stage.

10. A semiconductor device comprising said sample hold circuit defined in claim 6.

* * * * *